United States Patent
Ock et al.

(10) Patent No.: US 12,015,415 B1
(45) Date of Patent: Jun. 18, 2024

(54) HIGH GAIN LOW POWER PHASE DETECTOR AND LOOP FILTER FOR PHASE LOCK LOOP (PLL)

(71) Applicant: QUALCOMM Incorporated, San Diego, CA (US)

(72) Inventors: Sungmin Ock, San Diego, CA (US); Marzio Pedrali-Noy, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 36 days.

(21) Appl. No.: 18/086,565

(22) Filed: Dec. 21, 2022

(51) Int. Cl.
H03L 7/093 (2006.01)
H03L 7/099 (2006.01)

(52) U.S. Cl.
CPC ............ H03L 7/093 (2013.01); H03L 7/0992 (2013.01)

(58) Field of Classification Search
CPC .............................. H03L 7/093; H03L 7/0992
USPC ................................................ 331/17, 16, 34
See application file for complete search history.

(56) References Cited

U.S. PATENT DOCUMENTS

| | | | |
|---|---|---|---|
| 6,437,615 B1 | 8/2002 | Stascausky | |
| 8,847,642 B1 * | 9/2014 | Bunch | H03L 7/093 327/552 |
| 9,621,172 B1 * | 4/2017 | Yu | H03L 7/087 |
| 2005/0237092 A1 | 10/2005 | Kawago et al. | |
| 2007/0273415 A1 | 11/2007 | Kimura et al. | |
| 2008/0129353 A1 | 6/2008 | Lin | |
| 2008/0136535 A1 | 6/2008 | Khorram | |
| 2014/0312944 A1 | 10/2014 | Bunch et al. | |
| 2015/0200589 A1 | 7/2015 | Lee et al. | |
| 2016/0087525 A1 | 3/2016 | Zhu et al. | |
| 2022/0224348 A1 * | 7/2022 | Perrott | H03M 1/0687 |

FOREIGN PATENT DOCUMENTS

JP 3263621 B2 3/2002

OTHER PUBLICATIONS

International Search Report and Written Opinion—PCT/US2023/079893—ISA/EPO—Mar. 14, 2024.

* cited by examiner

*Primary Examiner* — Arnold M Kinkead
(74) *Attorney, Agent, or Firm* — Loza & Loza, LLP

(57) ABSTRACT

An apparatus including: a phase lock loop (PLL), including: a phase detector and loop pass filter (PD/LF), including: a phase/frequency detector including a first input configured to receive a reference signal, and a second input configured to receive a feedback signal, and an output configured to produce an output signal based on the reference and feedback signals; a first capacitor; and a charge pump, including: a charging path configured to generate a charging current to charge the first capacitor based on the output signal; and a discharging path including a first resistor configured to discharge the first capacitor.

23 Claims, 8 Drawing Sheets

HIGH GAIN LOW POWER PHASE DETECTOR AND LOOP FILTER FOR PHASE LOCK LOOP (PLL)

FIELD

Aspects of the present disclosure relate generally to phase lock loops (PLLs), and in particular, to a high gain, low power phase detector and loop filter (PD/LF) for PLLs.

BACKGROUND

A phase lock loop (PLL) may be used in a wireless communication system to generate a clock signal or local oscillator (LO) signal for controlling the transmission and/or reception of data signals. It may be desirable to generate the clock or LO signal with a certain low reference spurs and phase noise requirements to ensure successful transmission and/or reception of data signals. In some PLLs, the low reference spurs and phase noise requirements may be met by employing a phase detector and loop filter (PD/LF) that has a relatively high phase detection (PD) gain.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a phase lock loop (PLL), including: a phase detector and loop pass filter (PD/LF), including: a phase/frequency detector including a first input configured to receive a reference signal, and a second input configured to receive a feedback signal, and an output configured to generate an output signal based on the reference and feedback signals; a first capacitor; and a charge pump, including: a charging path configured to produce a charging current to charge the first capacitor based on the output signal; and a discharging path including a first resistor configured to discharge the first capacitor.

Another aspect of the disclosure relates to a method of generating a frequency control signal for a voltage controlled oscillator (VCO). The method includes generating a phase difference signal based on a reference signal and a feedback signal, wherein the feedback signal is based on a VCO signal generated by the VCO; partially discharging a first capacitor from a first voltage to a second voltage above ground potential during a discharging phase; and charging the first capacitor from the second voltage to a third voltage based on the phase difference signal during a charging phase, wherein the frequency control signal is based on the third voltage.

Another aspect of the disclosure relates to an apparatus for generating a frequency control signal for a voltage controlled oscillator (VCO). The apparatus includes: means for generating a phase difference signal based on a reference signal and a feedback signal, wherein the feedback signal is based on a VCO signal generated by the VCO; means for partially discharging a first capacitor from a first voltage to a second voltage above ground potential during a discharging phase; and means for charging the first capacitor from the second voltage to a third voltage based on the phase difference signal during a charging phase, wherein the frequency control signal is based on the third voltage.

Another aspect of the disclosure relates to a wireless communication device. The wireless communication device includes: at least one antenna; a transceiver coupled to the at least one antenna; one or more signal processing cores coupled to the transceiver; and a phase lock loop (PLL) coupled to the one or more signal processing cores. The PLL, in turn, comprises a phase detector and loop pass filter (PD/LF), comprising: a phase/frequency detector including a first input configured to receive a reference signal, and a second input configured to receive a feedback signal, and an output configured to produce an output signal based on the reference and feedback signals; a first capacitor; and a charge pump, comprising: a charging path configured to generate a charging current to charge the first capacitor based on the output signal; and a discharging path including a first resistor configured to discharge the first capacitor.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
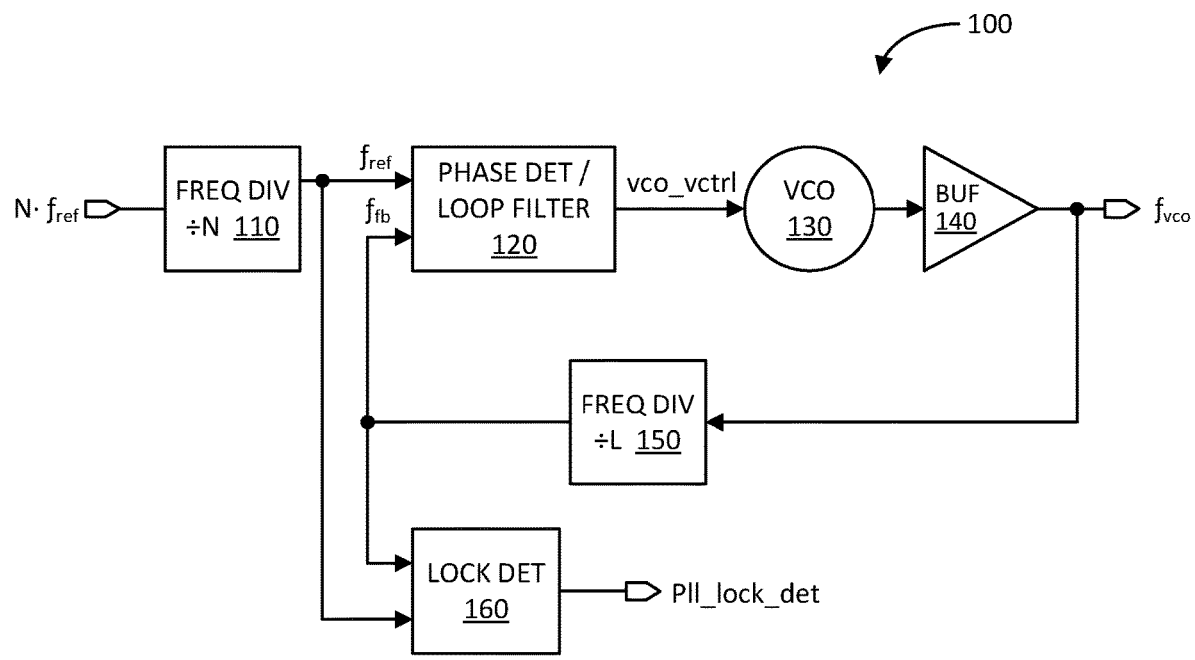
FIG. 1 illustrates a block diagram of an example phase lock loop (PLL) in accordance with an aspect of the disclosure.

FIG. 1 illustrates a block diagram of an example phase lock loop (PLL) 100 in accordance with an aspect of the disclosure. The PLL 100 includes a first frequency divider 110, a phase detector and loop filter 120 (collectively referred to herein as "PD/LF"), a voltage controlled oscillator (VCO) 130, a buffer 140, a second frequency divider 150, and a lock detector 160. It shall be understood that the implementation of the PLL 100 may vary significantly depending on specification and performance requirements.

The frequency divider 110 is configured to receive an input reference (clock) signal $N \cdot f_{ref}$ (e.g., a substantially periodic signal), and frequency divide the reference signal $N \cdot f_{ref}$ by a divider ratio N to generate a reference signal $f_{ref}$, where the divider ratio N may be an integer. The PD/LF 120 is configured to receive the reference signal $f_{ref}$ and a feedback signal fib at respective first and second inputs, compare the phases/frequencies of the reference and feedback signals $f_{ref}$ and $f_{fb}$, and generate a frequency control signal vco_vctrl based on a phase/frequency difference between the reference signal $f_{ref}$ and the feedback signal $f_{ref}$. The VCO 130 is configured to generate a VCO (clock) signal $f_{vco}$ based on the frequency control signal vco_vctrl; the VCO signal $f_{vco}$ being outputted by the buffer 140.

The second frequency divider 150 is configured to receive the VCO signal $f_{vco}$ from the buffer 140, and frequency divide the VCO signal $f_{vco}$ by a divider ratio L to generate the feedback signal $f_{fb}$, where the divider ratio L may also be an integer or a fractional number. The lock detector 160 is configured to generate an asserted pll_lock_det signal when the PLL 100 is in lock condition (and a deasserted pll_lock_det signal when the PLL 100 is not in lock condition). That is, in lock condition, the PD/LF 120 generates the frequency control signal vco_vctrl such that the feedback signal $f_{fb}$ (generated based the VCO signal $f_{vco}$ and the divider ratio L (e.g., $f_{fb}=f_{vco}/L$)) has a phase/frequency substantially the same or locked to the phase/frequency of the reference signal $f_{ref}$.

The PLL 100 may be implemented with different transfer functions depending on the loop filter implementation. For example, the PLL 100 may be implemented as a Type I PLL, where the transfer function includes one integrator by VCO. Alternatively, the PLL 100 may be implemented as a Type II PLL, where the transfer function includes two integrators by VCO and charge pump with loop filter. The Type I PLL has a higher bandwidth than the Type II PLL, and may be able to reduce phase noise better than the Type II PLL. Additionally, the Type II PLL typically requires large capacitors, which are difficult to implement in integrated circuits (ICs), and are often implemented as off-chip capacitors. Whereas, the capacitance requirement for a Type I PLL is much smaller, and loop filter capacitors may be implemented on-chip.

A Type I PLL typically requires higher phase detector (PD) gain to achieve good phase noise performance. As discussed further herein, two PD/LF architectures have been used to achieve high PD gain for improved loop gain.

Figure 2A:
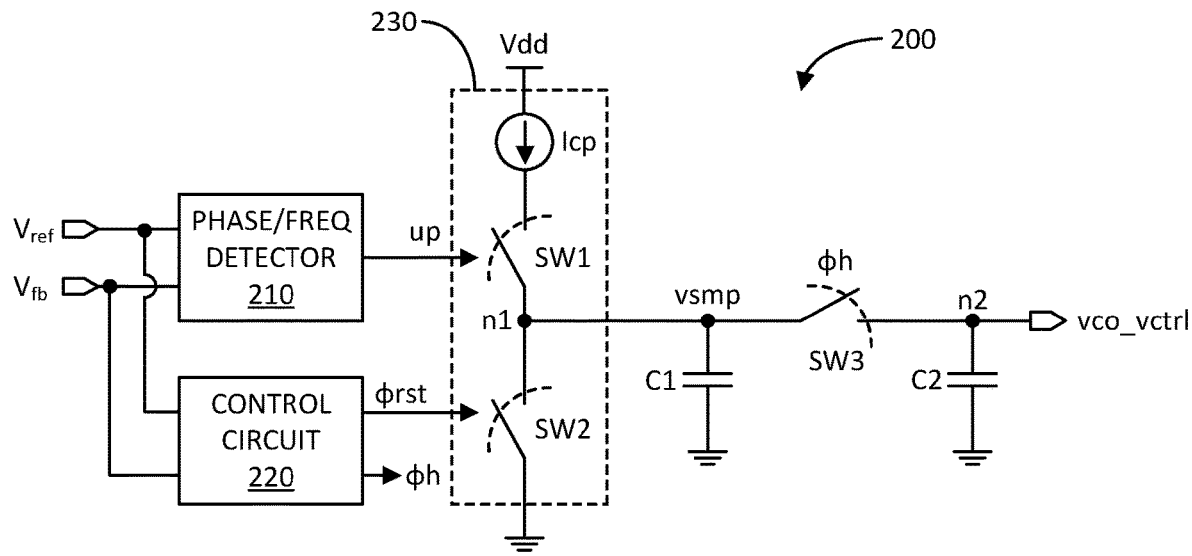
FIG. 2A illustrates a block/schematic diagram of an example phase detector and loop filter (PD/LF) in accordance with another aspect of the disclosure.

FIG. 2A illustrates a block/schematic diagram of an example phase detector and loop filter (PD/LF) 200 in accordance with another aspect of the disclosure. The PD/LF 200 may be an example implementation of the PD/LF 120 of PLL 100. In particular, the PD/LF 200 includes a phase/frequency detector 210, a control circuit 220, a charge pump 230 including a current source Icp, and first and second switching devices SW1 and SW2, first and second capacitors C1 and C2, and a third switching device SW3. The phase/frequency detector 210 includes inputs configured to receive a reference signal $V_{ref}$ and a feedback signal $V_{fb}$, respectively, and an output configured to produce an up signal based on a phase/frequency difference between the reference and feedback signals $V_{ref}$ and $V_{fb}$.

With regard to the charge pump 230, the current source Icp, the first switching device SW1, and the second switching device SW2 are coupled in series between an upper voltage rail Vdd and a lower voltage rail (e.g., ground or other negative voltage compared to the supply voltage on the upper voltage rail, which may be referred to hereinafter as "ground"). The current source Icp and the first switching device SW1 make up the charging path of the charge pump 230, and the second switching device SW2 make up the discharging path of the charge pump 230. The on/off (e.g., closed/open) state of the first switching device SW1 is controlled by the up signal generated by the phase/frequency detector 210. The control circuit 220, which may include respective inputs configured to receive the reference and feedback signals $V_{ref}$ and $V_{fb}$, is configured to generate a control signal ϕrst for controlling the on/off (e.g., closed/open) state of the second switching device SW2 based on the reference signal $V_{ref}$.

Figure 2B:
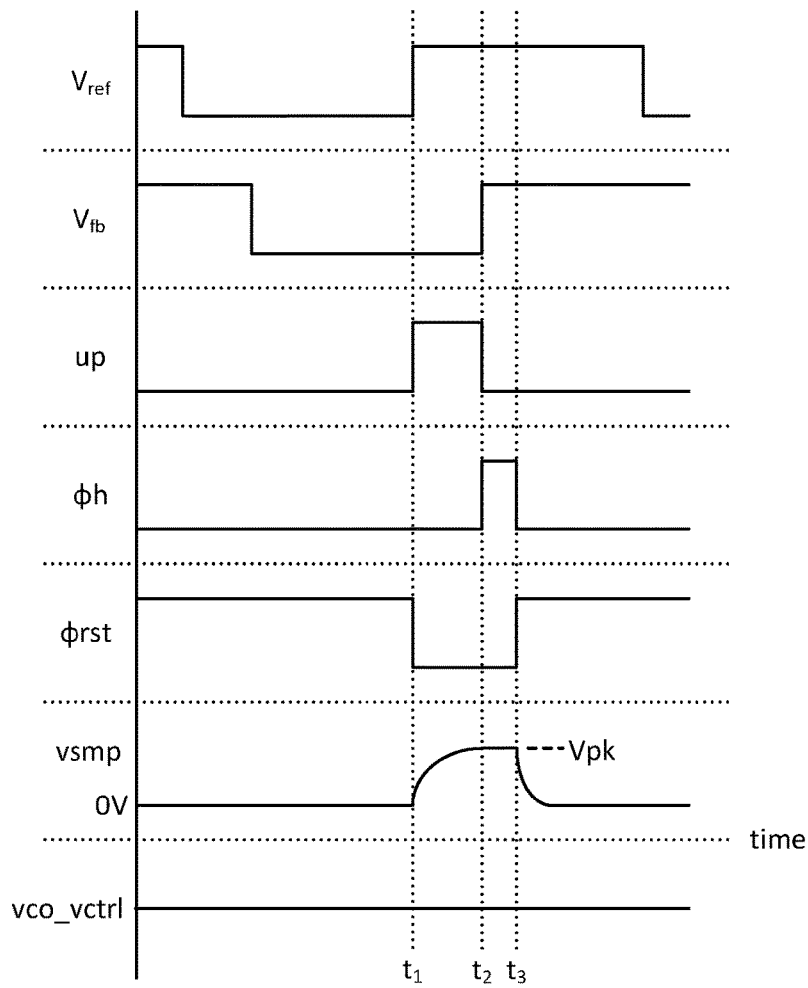
FIG. 2B illustrates a graph depicting signals related to an example operation of the phase detector and loop filter (PD/LF) of FIG. 2A in accordance with another aspect of the disclosure.

The first capacitor C1 is coupled between a first node n1 (between the first and second switching devices SW1 and SW2 of the charge pump 230) and ground. The third switching device SW3 is coupled between the first node n1 and a second node n2. The control circuit 220 is configured to generate a control signal ϕh for controlling the on/off (e.g., closed/open) state of the third switching device SW3 based on the feedback signal $V_{fb}$. The second capacitor C2 is coupled between the second node n2 and ground. As discussed further herein, a sampled signal or voltage vsmp is generated at the first node n1, and the frequency control signal or voltage vco_vctrl is generated at the second node n2. The operation of the PD/LF 200 is discussed as follows:

FIG. 2B illustrates a graph depicting signals related to an example operation of the PD/LF 200 in accordance with another aspect of the disclosure. The x- or horizontal axis represents time. The y- or vertical axis represents, from top to bottom, voltage levels of the reference signal $V_{ref}$, the feedback signal $V_{fb}$, the up signal, the control signal ϕh, the control signal ϕrst, the sampled signal vsmp, and the frequency control signal vco_vctrl.

With reference to the reference signal $V_{ref}$ and feedback signal $V_{fb}$ at the top two sections of the graph, a phase difference between the reference signal $V_{ref}$ and the feedback signal $V_{fb}$ is visualized with the reference signal $V_{ref}$ exhibiting a rising edge at time $t_1$ and the feedback signal $V_{fb}$ exhibiting a rising edge at time $t_2$. Thus, the time interval $t_1-t_2$ is related to the phase difference between the reference and feedback signals $V_{ref}$ and $V_{fb}$. The phase/frequency detector 210 detects the phase difference by asserting the up signal (e.g., at a high logic level) between times $t_1$ and $t_2$. In response to the asserted up signal, the first switching device SW1 is turned on to couple the current source Icp to the first capacitor C1 to charge the latter (e.g., enabling the charging path). Further, in response to the reference signal $V_{ref}$ becoming high at time $t_1$, the control circuit 220 deasserts the control signal ϕrst (e.g., at a low logic level) to turn off the second switching device SW2 (e.g., disabling the discharging path). Accordingly, the sampled signal vsmp increases from 0V at time $t_1$ to a peak voltage Vpk at time $t_2$, when the phase/frequency detector 210 deasserts the up signal as both the reference and feedback signals $V_{ref}$ and $V_{fb}$ are at the same or high logic levels.

Then at time $t_2$, when the feedback signal $V_{fb}$ exhibits the rising edge and the up signal becoming deasserted, the control circuit 220 asserts the control signal ϕh (e.g., at a high logic level) to turn on the third switching device SW2 and distribute the charge accumulated on the first capacitor C1 during the charging phase between the first and second capacitors C1 and C2 to form/adjust the frequency control signal or voltage vco_vctrl across both capacitors C1 and C2; and the first switching device SW1 is turned off in response to the up signal becoming deasserted. Then, at time $t_3$ (e.g., a defined time after time $t_2$ to sufficiently distribute the charge between capacitors C1 and C2), the control circuit 220 deasserts the control signal ϕh to open the third switching device SW3 and asserts the control signal ϕh to close the second switching device SW2 (e.g., enables the discharging path). The closing of the second switching device SW2 fully discharges the capacitor C1 so that the sampled signal vsmp decreases to substantially zero (0) Volt (V). This resets the capacitor C1 for the next charging phase.

The PD gain of the PD/LF 200 may be defined as the peak Vpk of the sampled signal vsmp over the phase difference between the reference and feedback signals $V_{ref}$ and $V_{fb}$ as indicated by the time interval $t_1-t_2$ (e.g., PD gain=Vpk/($t_1-t_2$)). The peak voltage Vpk is directly related to the charging current Icp. Thus, in the PD/LF 200, a way to increase the PD gain, so as to improve phase noise performance of the VCO 130, is to increase the charging current Icp.

Figure 3A:
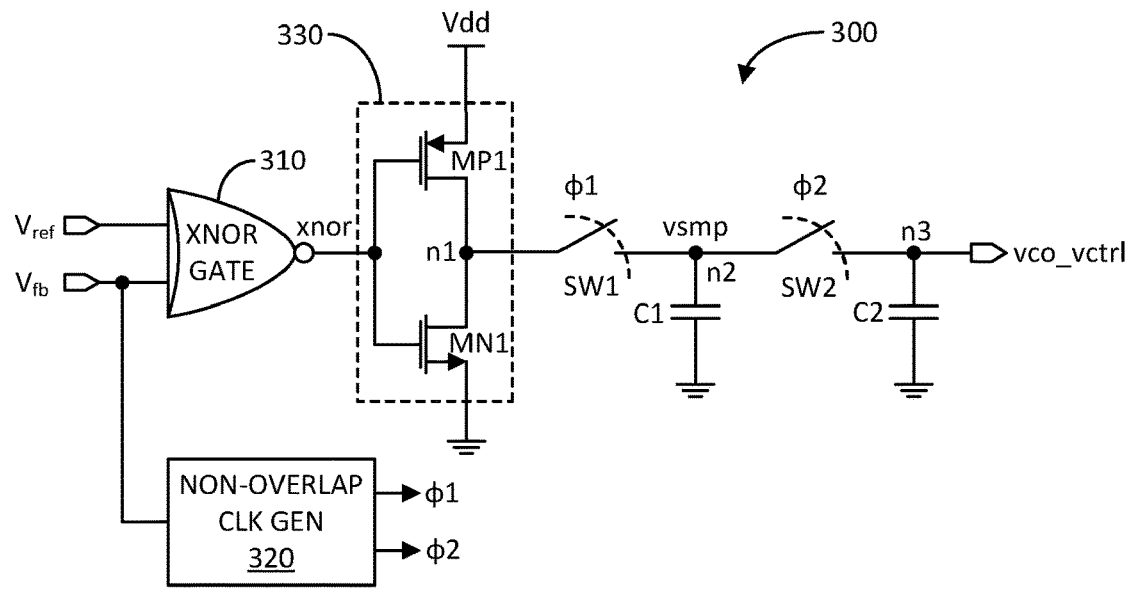
FIG. 3A illustrates a block/schematic diagram of another example phase detector and loop filter (PD/LF) in accordance with another aspect of the disclosure.

FIG. 3A illustrates a block/schematic diagram of another example phase detector and loop filter (PD/LF) 300 in accordance with another aspect of the disclosure. The PD/LF 300 may be another example implementation of the PD/LF 120 of PLL 100. In particular, the PD/LF 300 includes an exclusive-NOR (XNOR) gate 310 serving as a phase/frequency detector, a non-overlapping clock generator 320, a charge pump 330 including a first field effect transistor (FET) MP1 (e.g., a p-channel metal oxide semiconductor FET or PMOS FET), a second FET MN1 (e.g., an n-channel metal oxide semiconductor FET or NMOS FET), first and second switching devices SW1 and SW2, and first and second capacitors C1 and C2.

The XNOR gate 310 is configured to generate/output a signal xnor based on a phase difference between a reference signal $V_{ref}$ and a feedback signal $V_{fb}$ received at respective inputs thereof. The charge pump 330 includes an input coupled to the output of the XNOR gate 310 to receive the xnor signal therefrom. The FET MP1 and FET MN1 are coupled in series between an upper voltage rail Vdd and a lower voltage rail (e.g., ground). That is, the FET MP1 includes a source coupled to the upper voltage rail Vdd, a gate coupled to the output of the XNOR gate 310, and a drain coupled to a drain of FET MN1 at a first node n1 (e.g., output of the charge pump 330). The FET MN1 includes a gate coupled to the output of the XNOR gate 310 (e.g., the coupled-together gates of FETs MP1 and MN1 serve as the input of the charge pump 330), and a source coupled to ground.

Figure 3B:
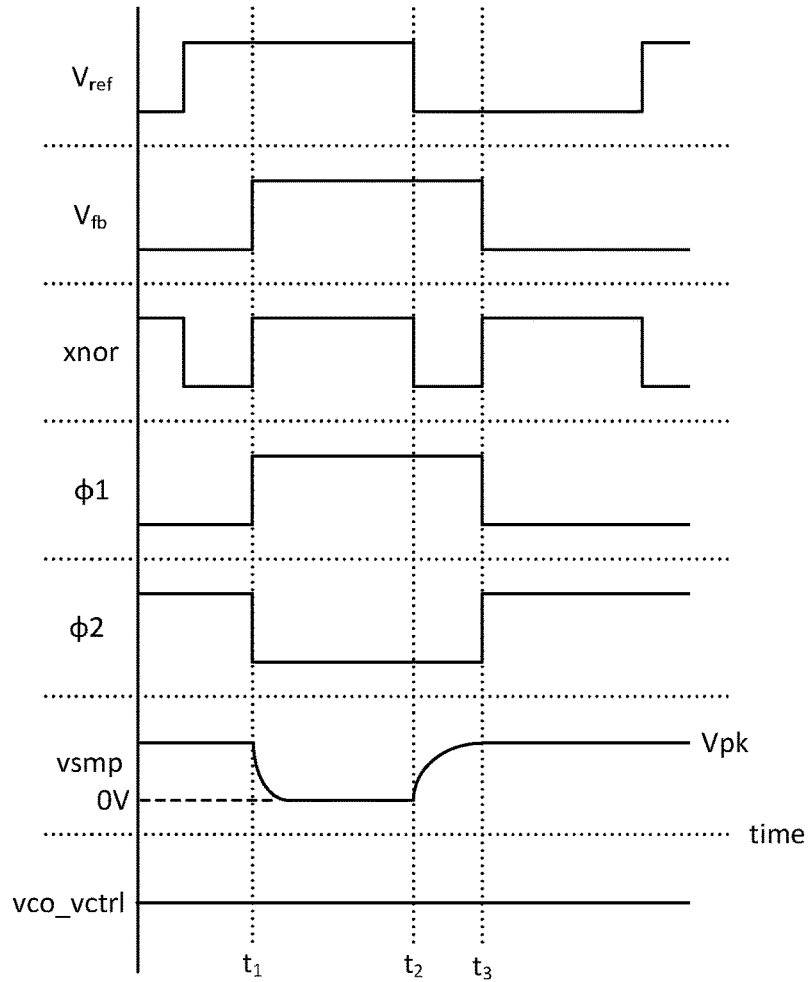
FIG. 3B illustrates a graph depicting signals related to an example operation of the phase detector and loop filter (PD/LF) of FIG. 3A in accordance with another aspect of the disclosure.

The first switching device SW1 is coupled between the first node n1 and a second node n2. The first capacitor C1 is coupled between the second node n2 and ground. The second switching device SW2 is coupled between the second node n2 and a third node n3. The non-overlapping clock generator 320, which may include an input configured to receive the feedback signal $V_{fb}$, is configured to generate complementary clock signals ϕ1 and ϕ2 for controlling the on/off (e.g., closed/open) states of the first and second switching devices SW1 and SW2 based on the feedback signal $V_{fb}$, respectively. As discussed further herein, a sampled signal vsmp is generated at the second node n2, and the frequency control signal or voltage vco_vctrl is generated at the third node n3. The operation of the PD/LF 300 is discussed as follows:

FIG. 3B illustrates a graph depicting signals related to an example operation of the PD/LF 300 in accordance with another aspect of the disclosure. The x- or horizontal axis represents time. The y- or vertical axis represents, from top to bottom, voltage levels of the reference signal $V_{ref}$, the feedback signal $V_{fb}$, the xnor signal, the non-complementary clock signal ϕ1, the complementary clock signal ϕ2, the sampled signal vsmp, and the frequency control signal vco_vctrl.

Pursuant to a discharging phase between times $t_1$ and $t_2$, the non-overlapping clock generator 320 generates the non-complementary and complementary clock signals ϕ1 and ϕ2 at asserted (e.g., high) and deasserted (e.g., low) logic levels, respectively. The high clock signal ϕ1 turns on the first switching device SW1 for discharging the first capacitor C1, and the low clock signal ϕ2 turns off the second switching device SW2 to isolate the second capacitor C2 from the discharging phase of the first capacitor C1. Also, between times $t_1$ and $t_2$, the XNOR gate 310 generates the xnor signal at a high logic level in response to both the reference and feedback signals $V_{ref}$ and $V_{fb}$ being at the same (e.g., high) logic levels. The high xnor signal turns off FET MP1 (e.g., disables the charging path), and turns on FET MN1 to couple the upper terminal of the first capacitor C1 at node n2 to ground via the first switching device SW1 (e.g., enables the discharging path), so as to fully discharge the first capacitor C1. As illustrated in the graph, sampled voltage vsmp discharges to 0V beginning at time $t_1$.

With reference to the reference signal $V_{ref}$ and feedback signal $V_{fb}$ at the top two sections of the graph, a phase difference between the reference signal $V_{ref}$ and the feedback signal $V_{fb}$ is visualized with the reference signal $V_{ref}$ exhibiting a falling edge at time $t_2$ and the reference signal $V_{fb}$ exhibiting a falling edge at time $t_3$. Thus, the time interval $t_2-t_3$ is related to the phase difference between the reference and feedback signals $V_{ref}$ and $V_{fb}$. The XNOR gate 310 detects the phase difference by setting the xnor signal to an asserted (e.g., low) logic level between times $t_2$ and $t_3$. In response to the low logic signal xnor, the FET MP1 turns on (e.g., enabling the charging path) and the FET MN1 turns off (e.g., disabling the discharging path). The turned-on FET MP1 couples the upper voltage rail Vdd to the first capacitor C1 to charge the latter. Accordingly, the sampled signal vsmp increases from 0V at time $t_2$ to a peak voltage Vpk at time $t_3$, when the XNOR gate 310 detects that both the reference and feedback signals $V_{ref}$ and $V_{fb}$ are at the same (e.g., low) logic levels, and generates the xnor signal at a deasserted (e.g., high) logic level.

Then at time $t_3$, when the clock signals φ1 and φ2 become deasserted (e.g., low) and asserted (e.g., high), respectively, the first and second switching devices SW1 and SW2 are turned off and on, respectively. The turned-on second switching device SW2 causes a distribution of the charge accumulated on the first capacitor C1 during the charging phase between the first and second capacitors C1 and C2 to form/adjust the frequency control signal or voltage vco_vctrl across both capacitors C1 and C2. The turned-off first switching device SW1 isolates the capacitors C1 and C2 from ground via the turned-on FET MN1 responsive to the high xnor signal at time $t_3$.

Similarly, the PD gain of the PD/LF 300 may be defined as the peak Vpk of the sampled signal vsamp over the phase difference between the reference and feedback signals $V_{ref}$ and $V_{fb}$, as indicated by the time interval $t_2$–$t_3$ (e.g., PD gain=Vpk/($t_2$–$t_3$)). The peak voltage Vpk is directly related to the supply voltage Vdd, the turn-on resistance of FET MP1, and the resistance of the turned-on first switching device SW1. As Vdd may be constant and the turn-on resistance of the first switching device SW1 might have substantially small resistance, in the PD/LF 300, a way to increase the PD gain, so as to improve the phase noise performance of the VCO 130, is to increase size of the FET MP1 so as to reduce its turn-on resistance.

Figure 4:
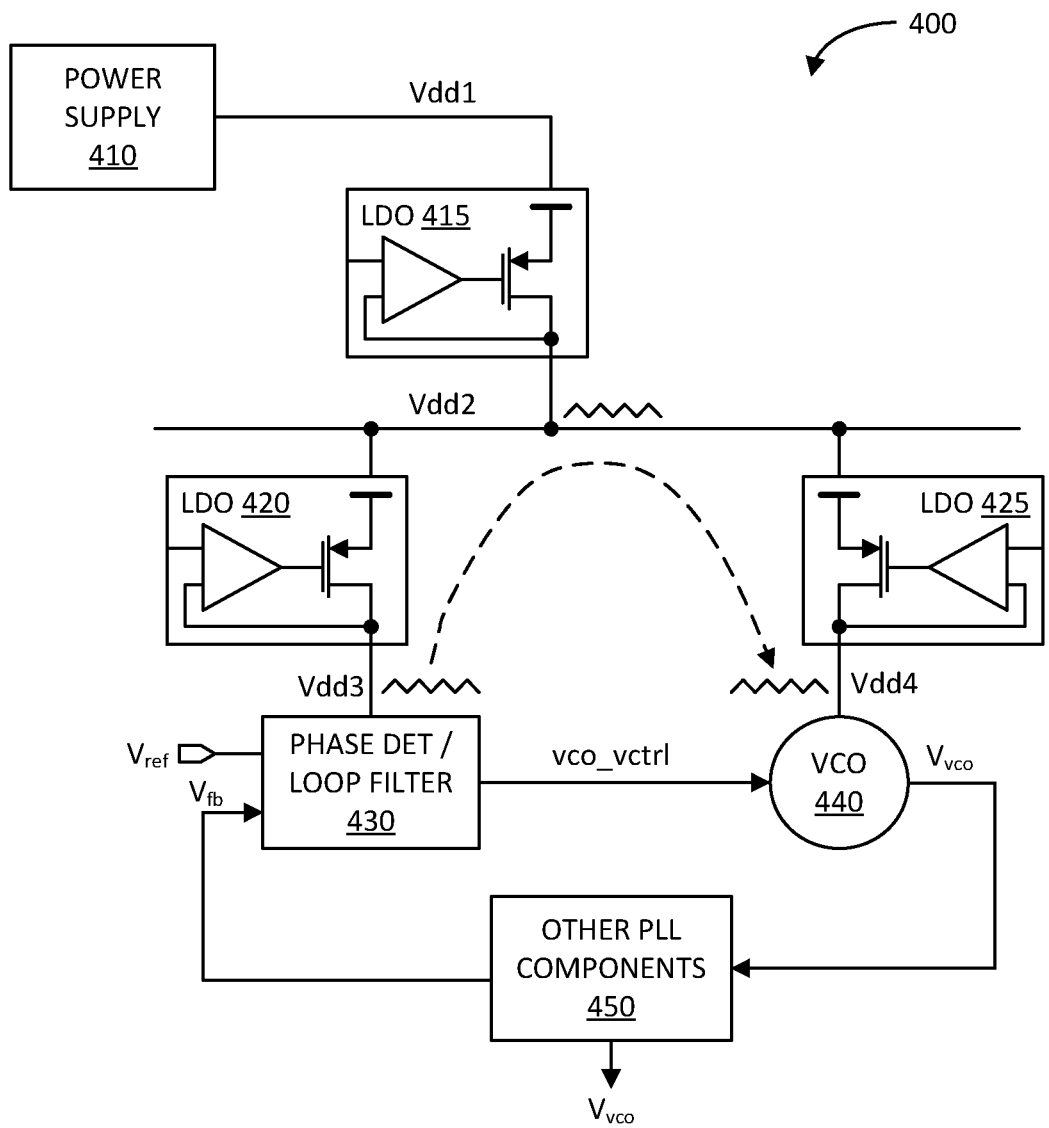
FIG. 4 illustrates a block diagram of another example phase lock loop (PLL) in accordance with another aspect of the disclosure.

FIG. 4 illustrates a block diagram of another example phase lock loop (PLL) 400 in accordance with another aspect of the disclosure. The PLL 400 includes a phase detector and loop filter (PD/LF) 430, a voltage controlled oscillator (VCO) 440, and other PLL components 450 (e.g., a buffer, a frequency divider (e.g., integer or fractional), a sigma delta modulator, a lock detector, etc.). The PD/LF 430 includes inputs configured to receive a reference signal $V_{ref}$ and a feedback signal $V_{fb}$, and generate a frequency control signal vco_vctrl based on a phase difference between the reference and feedback signals $V_{ref}$ and $V_{fb}$. The VCO 440 is configured to generate a VCO signal $V_{vco}$ based on the frequency control signal vco_vctrl. The other PLL components 450 may include a buffer to output the VCO signal $V_{vco}$, and at least one frequency divider configured to generate the feedback signal $V_{fb}$ based on (e.g., by frequency dividing) the VCO signal $V_{vco}$.

For supplying power to the PD/LF 430 and the VCO 440, the PLL 400 further includes or is associated with a power supply 410, and first, second, and third low dropout (LDO) regulators 415, 420, and 425. The power supply 410, which may be implemented as a power management integrated circuit (PMIC), is configured to generate a first supply voltage Vdd1. The first LDO regulator 415 is configured to generate a second supply voltage Vdd2 based on the first supply voltage Vdd1. The second LDO regulator 420 is configured to generate a third supply voltage Vdd3 for the PD/LF 430 based on the second supply voltage Vdd2. Similarly, the third LDO regulator 425 is configured to generate a fourth supply voltage Vdd4 for the VCO 440 based on the second supply voltage Vdd2.

As discussed with reference to PD/LFs 200 and 300, a higher PD gain typically improves the phase noise characteristics of the VCO 440. Further, as previously mentioned, achieving higher PD gain in PD/LFs 200 and 300 typically involves increasing the charging current, such as by increasing the current supplied by current source Icp in PD/LF 200 or increasing a size of the FET MP1 in PD/LF 300.

However, increasing the charging current in PD/LFs 200 and 300 typically produces voltage ripple, for example, on the corresponding power supply Vdd3, as represented by a triangular waveform juxtaposed with the third supply voltage Vdd3. The voltage ripple is the result of the periodic charging and discharging of the first capacitor C1 to generate the frequency control signal vco_vctrl based on the phase difference between the reference and feedback signals $V_{ref}$ and $V_{fb}$, as discussed.

Typically, the second LDO regulator 420 is not ideal; and therefore, the voltage ripple produced in the third supply voltage Vdd3 propagates to the second supply voltage Vdd2, as indicated by the dashed arrow line. Similarly, the third LDO regulator 425 is also not ideal; and therefore the voltage ripple, that has propagated to the second supply voltage Vdd2, propagates to the fourth supply voltage Vdd4 for the VCO 440, as also indicated by the dashed arrow line. The voltage ripple on the VCO supply voltage Vdd4 adversely affects the reference spurs and phase noise characteristics of the VCO 440. Thus, any VCO characteristic benefits achieved by increasing charging current to increase the PD gain in the PD/LF 430 may have adverse effects on the VCO characteristics due to the increased voltage ripple due to the higher charging current.

Figure 5A:
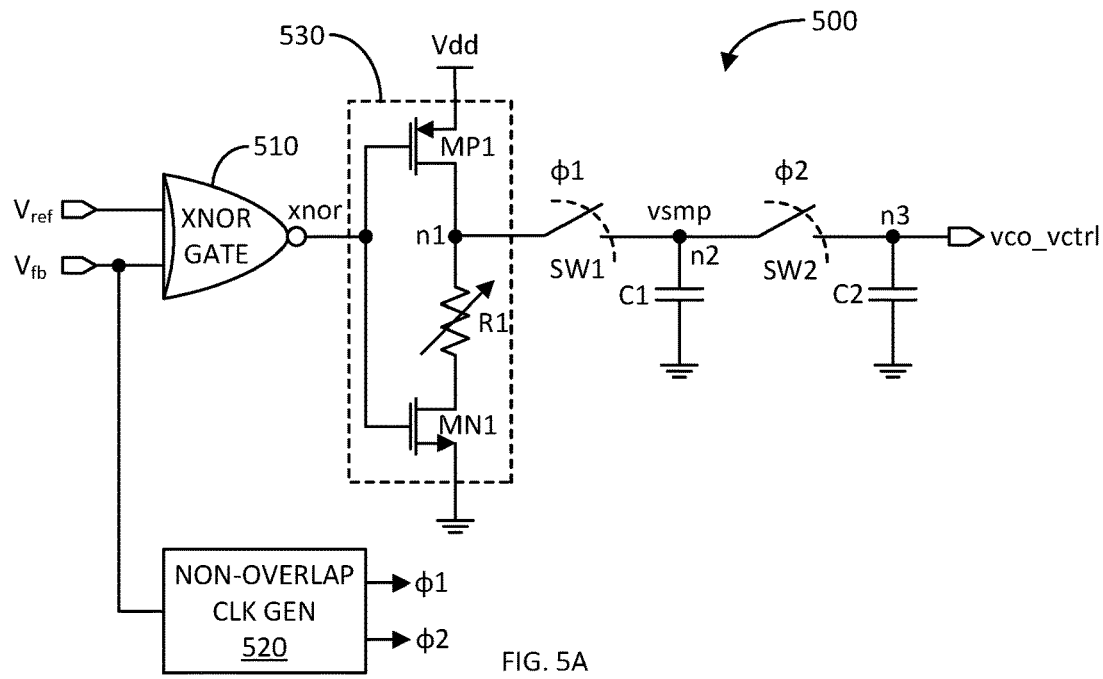
FIG. 5A illustrates a block/schematic diagram of another example phase detector and loop filter (PD/LF) in accordance with another aspect of the disclosure.

FIG. 5A illustrates a block/schematic diagram of another example phase detector and loop filter (PD/LF) 500 in accordance with another aspect of the disclosure. As discussed in more detail further herein, the PD/LF 500 improves phase detection (PD) gain based on the discharging phase of the first capacitor C1 in contrast to the PD/LFs 200 and 300 that improves PD gain based on the charging phase of the first capacitor C1. However, it shall be understood that the PD/LF 500 may improve PD gain based on both the charging and discharging phases of the first capacitor C1.

In particular, the PD/LF 500 is a variation of the PD/LF 300 previously discussed, and includes many of the same/similar components, such as: an XNOR gate 510 configured to generate an xnor signal based on a phase difference between a reference signal $V_{ref}$ and a feedback signal $V_{fb}$; a non-overlapping clock generator 520 configured to generate complementary clock signals φ1 and φ2 based on the feedback signal $V_{fb}$; a first switching device SW1, whose on/off state is controlled by the non-complementary clock signal φ1, coupled between a first node n1 and a second node n2; a first capacitor C1 coupled between the second node n2 and a lower voltage rail (e.g., ground); a second switching device SW2, whose on/off state is controlled by complementary clock signal φ2, coupled between the second node n2 and a third node n3; and a second capacitor C2 coupled between the third node n3 and ground. The sampled signal vsmp and the frequency control signal vco_vctrl are generated at nodes n2 and n3, respectively.

As discussed above, the PD/LF 500 improves the PD gain based on the discharging phase of the first capacitor C1. In this regard, the PD/LF 500 includes a charge pump 530 including a first FET MP1 (e.g., a PMOS FET), a resistor R1 (which could be a variable resistor), and a second FET MN1 (e.g., an NMOS FET) coupled in series between an upper voltage rail Vdd and ground. That is, the first FET MP1 includes a source coupled to the upper voltage rail Vdd, a gate coupled to the output of the XNOR gate 510, and a drain coupled to node n1 (e.g., output of the charge pump 530). Accordingly, the FET MP1 make up the charging path of the charge pump 530. The resistor R1 is coupled between node n1 and a drain of FET MN1. Accordingly, the resistor R1 and the FET MN1 make up the discharging path of the charge pump 530. The FET MN1 includes a gate also coupled to the output of the XNOR gate 510, and serving, along with the gate of FET MP1, as the input of the charge pump 530. The FET MN1 includes a source coupled to ground.

As discussed in more detail with reference to a signal timing diagram discussed below, the resistor R1 may result in a partial discharging of the first capacitor C1 during a discharging phase. In doing so, the sampled voltage vsmp at the top terminal (at node n2) of the first capacitor C1 does not discharge to all the way to ground (0V), but to some voltage Vst above ground. Accordingly, in the next charging phase, the sampled voltage vsmp starts at the voltage Vst and rises in accordance with the charging current to generate the sampled voltage vsmp with a higher peak Vpk. As the PD gain of the PD/LF 500 is directly related to the peak Vpk of the sampled voltage vsmp, higher PD gain may be achieved by controlling the discharging of the first capacitor C1 via the variable resistor R1.

Figure 5B:
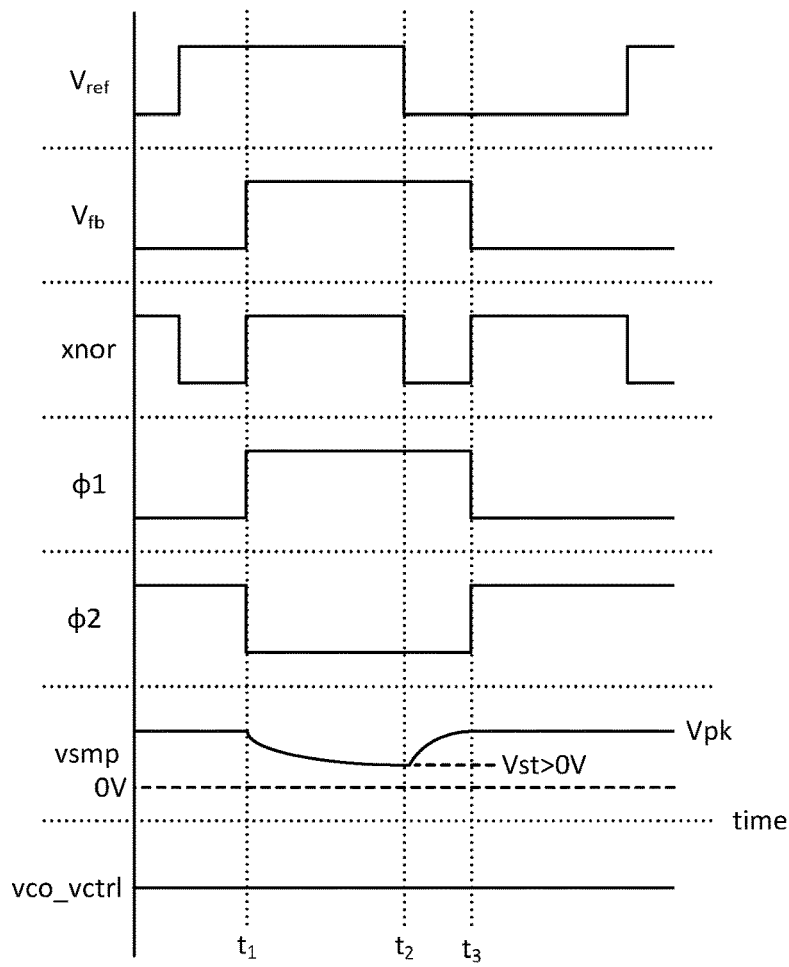
FIG. 5B illustrates a graph depicting signals related to an example operation of the phase detector and loop filter (PD/LF) of FIG. 5A in accordance with another aspect of the disclosure.

FIG. 5B illustrates a graph depicting signals related to an example operation of the PD/LF 500 in accordance with another aspect of the disclosure. The x- or horizontal axis represents time. The y- or vertical axis represents, from top to bottom, voltage levels of the reference signal $V_{ref}$, the feedback signal $V_{fb}$, the xnor signal, the non-complementary clock signal φ1, the complementary clock signal φ2, the sampled signal vsmp, and the frequency control signal vco_vctrl.

Pursuant to a discharging phase between times $t_1$ and $t_2$, the non-overlapping clock generator 520 generates the non-complementary and complementary clock signals φ1 and φ2 at asserted (e.g., high) and deasserted (e.g., low) logic levels, respectively. The high clock signal φ1 turns on the first switching device SW1 for discharging the first capacitor C1, and the low clock signal φ2 turns off the second switching device SW2 to isolate the second capacitor C2 from the discharging phase of the first capacitor C1. Also, between times $t_1$ and $t_2$, the XNOR gate 510 generates the xnor signal at a high logic level in response to both the reference and feedback signals $V_{ref}$ and $V_{fb}$ being at the same (e.g., high) logic levels. The high xnor signal turns off FET MP1 (e.g., disables the charging path), and turns on FET MN1 to couple the upper terminal of the first capacitor C1 at node n2 to ground via the first switching device SW1 and the resistor R1 (e.g., enables the discharging path).

As illustrated in the graph, the sampled voltage vsmp begins to discharge at time $t_1$. In this case (e.g., in contrast to the operation of PD/LF 300), the resistor R1 reduces the rate of discharging the first capacitor C1 such that the sampled signal vsmp does not discharge all the way to ground, but rather to a start voltage Vst above ground (e.g., Vst>0V). Accordingly, as discussed below, when the charging phase begins, the sampled signal vsmp is at Vst, which achieves a higher peak voltage Vpk for the sampled voltage vsmp. The resistor R1 may be variable to set the start voltage Vst.

For instance, with reference to the reference signal $V_{ref}$ and feedback signal $V_{fb}$ at the top two sections of the graph, a phase difference between the reference signal $V_{ref}$ and the feedback signal $V_{fb}$ is visualized with the reference signal $V_{ref}$ exhibiting a falling edge at time $t_2$ and the reference signal $V_{fb}$ exhibiting a falling edge at time $t_3$. Thus, the time interval $t_2$-$t_3$ is related to the phase difference between the reference and feedback signals $V_{ref}$ and $V_{fb}$. The XNOR gate 510 detects the phase difference by setting the xnor signal to an asserted (e.g., low) logic level between times $t_2$ and $t_3$. In response to the low logic signal xnor, the FET MP1 turns on (e.g., enabling the charging path) and the FET MN1 turns off (e.g., disabling the discharging path). The turned-on FET MP1 couples the upper voltage rail Vdd to the first capacitor C1 to charge the latter. Accordingly, the sampled signal vsmp increases from Vst at time $t_2$ to a peak voltage Vpk at time $t_3$, when the XNOR gate 510 detects that both the reference and feedback signals $V_{ref}$ and $V_{fb}$ are at the same (e.g., low) logic levels, and generates the xnor signal at a deasserted (e.g., high) logic level.

Then at time $t_3$, when the clock signals φ1 and φ2 become deasserted (e.g., low) and asserted (e.g., high), respectively, the first and second switching devices SW1 and SW2 are turned off and on, respectively. The turned-on second switching device SW2 causes a distribution of the charge accumulated on the first capacitor C1 during the charging phase between the first and second capacitors C1 and C2 to form/adjust the frequency control signal or voltage vco_vctrl cross both capacitors C1 and C2. The turned-off first switching device SW1 isolates the capacitors C1 and C2 from ground via the turned-on FET MN1 responsive to the high xnor signal at time $t_3$.

Thus, by partially discharging the capacitor C1 during the discharging phase between times $t_1$ and $t_2$, the following charging phase between times $t_2$ and $t_3$ begins with the sampled voltage vsmp starting at a voltage Vst above ground potential (0V). This allows a higher peak voltage Vpk to be achieved, which produces a higher PD gain (e.g., Vpk/($t_2$-$t_3$)) for reduced reference spurs and phase noise in the VCO signal $V_{vco}$. Further, as the increase in PD gain is not attributed to an increase in the charging current, there may be no adverse impact on voltage ripple in the supply rail Vdd4 of the VCO 440 so as not to impact the reference spur and phase noise characteristics of the VCO 440. Moreover, as the charging current need not increase, and may even be reduced, while achieving higher PD gain, the PD/LF 500 consume significantly less power.

Figure 6A:
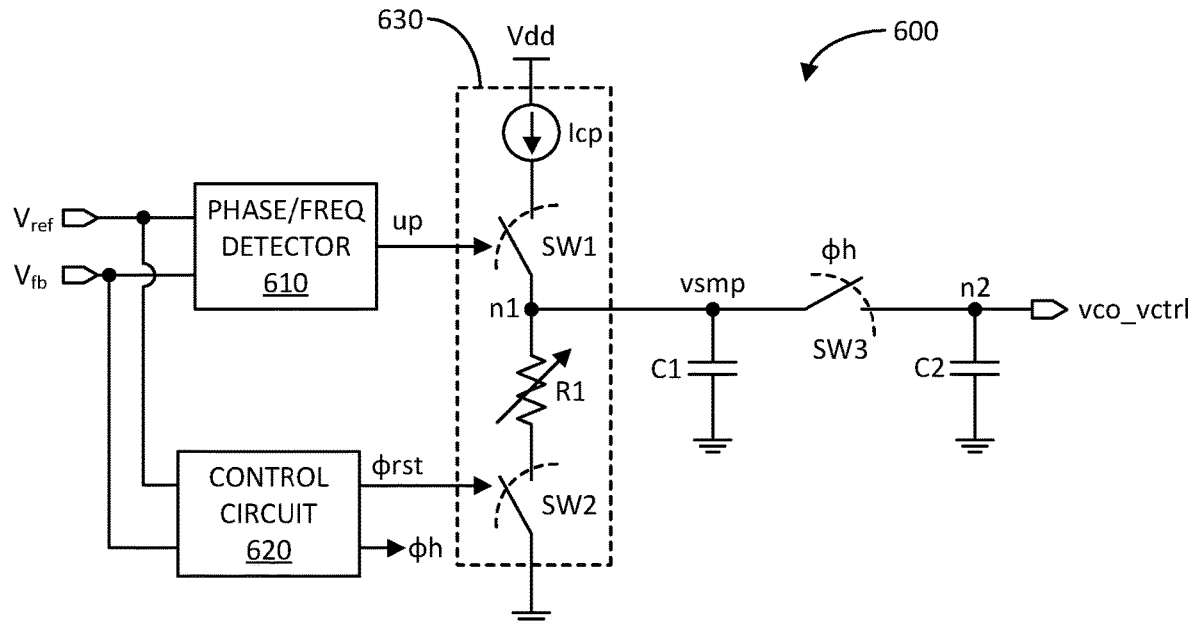
FIG. 6A illustrates a block/schematic diagram of another example phase detector and loop filter (PD/LF) in accordance with another aspect of the disclosure.

FIG. 6A illustrates a block/schematic diagram of another example phase detector and loop filter (PD/LF) 600 in accordance with another aspect of the disclosure. The PD/LF 600 may be an example implementation of the PD/LF 120 of PLL 100. Similar to PD/LF 500, the PD/LF 600 improves phase detection (PD) gain based on the discharging phase of the first capacitor C1 in contrast to the PD/LFs 200 and 300 that improves PD gain based on the charging phase of the first capacitor C1. However, it shall be understood that the PD/LF 600 may improve PD gain based on both the charging and discharging phases of the first capacitor C1.

In particular, the PD/LF 600 includes a phase/frequency detector 610, a control circuit 620, and a charge pump 530 including a current source Icp, first and second switching devices SW1 and SW2, and a resistor R1 (e.g., which may be a variable resistor). The PD/LF 600 further includes a third switching device SW3, and first and second capacitors C1 and C2. The phase/frequency detector 610 includes inputs configured to receive a reference signal $V_{ref}$ and a feedback signal $V_{fb}$, respectively, and an output to produce an up signal based on a phase/frequency difference between the reference and feedback signals $V_{ref}$ and $V_{fb}$.

With regard to the charge pump 230, the current source Icp, the first switching device SW1, the resistor R1, and the second switching device SW2 are coupled in series between an upper voltage rail Vdd and a lower voltage rail (e.g., ground). The current source Icp and the first switching device SW1 make up the charging path of the current source 630, and the resistor R1 and second switching device SW2 make up the discharging path of the current source 630. The on/off (e.g., closed/open) state of the first switching device SW1 is controlled by the up signal generated by the phase/frequency detector 610. The control circuit 620, which may include respective inputs configured to receive the reference and feedback signals $V_{ref}$ and $V_{fb}$, is configured to generate a control signal φrst for controlling the on/off (e.g., closed/open) state of the second switching device SW2 based on the reference signal $V_{ref}$.

Figure 6B:
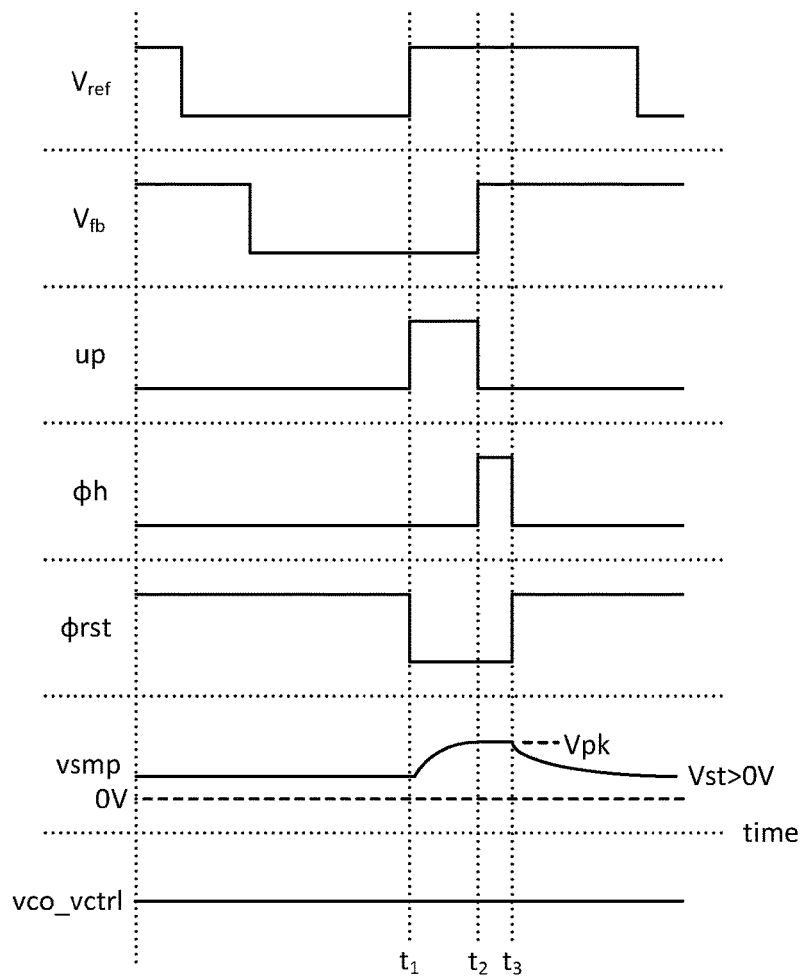
FIG. 6B illustrates a graph depicting signals related to an example operation of the phase detector and loop filter (PD/LF) of FIG. 6A in accordance with another aspect of the disclosure.

The first capacitor C1 is coupled between a first node n1 (between the first switching device SW1 and the resistor R1 of the charge pump 630) and ground. The third switching device SW3 is coupled between the first node n1 and a second node n2. The control circuit 620 is configured to generate a control signal φh for controlling the on/off (e.g., closed/open) state of the third switching device SW3 based on the feedback signal $V_{fb}$. The second capacitor C2 is coupled between the second node n2 and ground. As discussed further herein, a sampled signal or voltage vsmp is generated at the first node n1, and the frequency control signal or voltage vco_vctrl is generated at the second node n2. The operation of the PD/LF 600 is discussed as follows:

FIG. 6B illustrates a graph depicting example signals related to an example operation of the PD/LF 600 in accordance with another aspect of the disclosure. The x- or horizontal axis represents time. The y- or vertical axis represents, from top to bottom, the voltage levels of the reference signal $V_{ref}$, the feedback signal $V_{fb}$, the up signal, the control signal φh, the control signal φrst, the sampled signal vsmp, and the frequency control signal vco_vctrl.

With reference to the reference signal $V_{ref}$ and feedback signal $V_{fb}$ at the top two sections of the graph, a phase difference between the reference signal $V_{ref}$ and the feedback signal $V_{fb}$ is visualized with the reference signal $V_{ref}$ exhibiting a rising edge at time $t_1$ and the reference signal $V_{fb}$ exhibiting a rising edge at time $t_2$. Thus, the time interval $t_1-t_2$ is related to the phase difference between the reference and feedback signals $V_{ref}$ and $V_{fb}$. The phase/frequency detector 610 detects the phase difference by asserting the up signal (e.g., at a high logic level) between times $t_1$ and $t_2$. In response to the asserted up signal, the first switching device SW1 is turned on to couple the current source Icp to the first capacitor C1 to charge the latter (e.g., enabling the charging path). Further, in response to the reference signal $V_{ref}$ becoming high at time $t_1$, the control circuit 620 deasserts the signal φrst (e.g., at a low logic level) to turn off the second switching device SW2 (e.g., disabling the discharging path). Accordingly, the sampled signal vsmp increases from a start voltage Vst at time $t_1$ (e.g., Vst>0V) to a peak voltage Vpk at time $t_2$, when the phase/frequency detector 610 deasserts the up signal as both the reference and feedback signals $V_{ref}$ and $V_{fb}$ are at the same or high logic levels.

Then at time $t_2$, when the feedback signal $V_{fb}$ exhibits the rising edge and the up signal becomes deasserted, the control circuit 620 asserts the control signal φh (e.g., at a high logic level) to turn on the third switching device SW3 and distribute the charge accumulated on the first capacitor C1 during the charging phase between the first and second capacitors C1 and C2 to form/adjust the frequency control signal or voltage vco_vctrl across both capacitors C1 and C2; and the first switching device SW1 is turned off in response to the up signal becoming deasserted. Then, at time $t_3$ (e.g., a defined time after time $t_2$ to sufficiently distribute the charge between capacitors C1 and C2), the control circuit 620 deasserts the control signal φh to open the third switching device SW3 and asserts the control signal φh to close the second switching device SW2 (e.g., enables the discharging path). The closing of the second switching device SW2 partially discharges the capacitor C1 via the variable resistor R1 so that the sampled signal vsmp decreases to the start voltage Vst. The resistor R1 may be variable to set the start voltage Vst.

Thus, by partially discharging the capacitor C1 during the discharging phase, the charging phase between times $t_1$ and $t_2$ begins with the sampled voltage vsmp starting at the start voltage Vst above ground potential (0V). This allows a higher peak voltage Vpk to be achieved, which produces a higher PD gain (e.g., Vpk/($t_1-t_2$)) for reduced reference spurs and phase noise in the VCO signal Vvco. Further, as the increase in PD gain is not attributed to an increase in the charging current, there may be no adverse impact on voltage ripple in the supply rail Vdd4 of the VCO 440 so as not to impact the reference spur and phase noise characteristics of the VCO 440. Moreover, as the charging current need not increase, and may even be reduced while achieving the higher PD gain, the PD/LF 600 may consume significantly less power.

Figure 7:
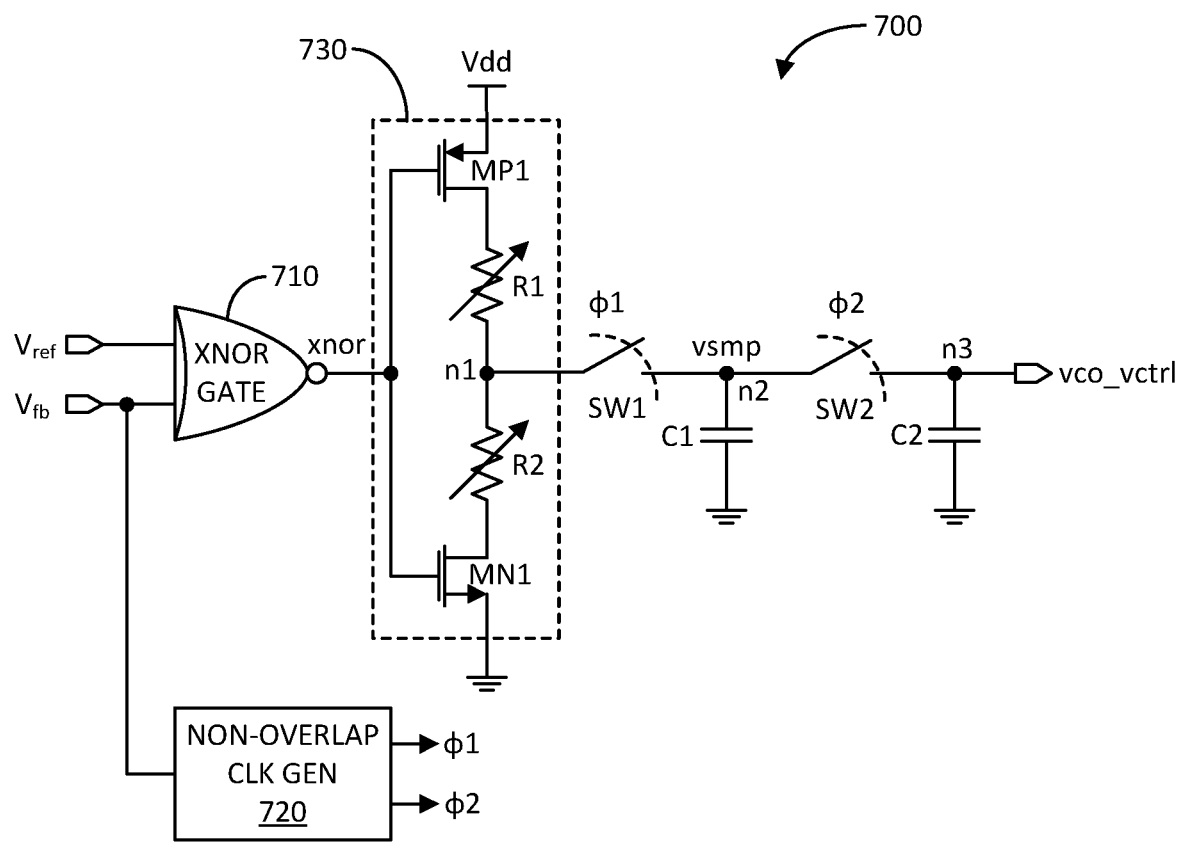
FIG. 7 illustrates a block/schematic diagram of another example phase detector and loop filter (PD/LF) in accordance with another aspect of the disclosure.

FIG. 7 illustrates a block/schematic diagram of another example phase detector and loop filter (PD/LF) 700 in accordance with another aspect of the disclosure. The PD/LF 700 is a variation of the PD/LF 500 previously discussed, in that the PD/LF 700 further includes a resistor in the charging path to reduce PD gain variation as a result of the non-linear turn-on resistance of the FET MP1.

In particular, the PD/LF 700 includes an XNOR gate 710 configured to generate an xnor signal based on a phase difference between a reference signal $V_{ref}$ and a feedback signal $V_{fb}$; a non-overlapping clock generator 720 configured to generate complementary clock signals φ1 and φ2 based on the feedback signal $V_{fb}$; a first switching device SW1, whose on/off state is controlled by the non-complementary clock signal φ1, coupled between a first node n1 and a second node n2; a first capacitor C1 coupled between the second node n2 and a lower voltage rail (e.g., ground); a second switching device SW2, whose on/off state is controlled by complementary clock signal φ2, coupled between the second node n2 and a third node n3; and a second capacitor C2 coupled between the third node n3 and ground. The sampled signal vsmp and the frequency control signal vco_vctrl are generated at nodes n2 and n3, respectively.

As discussed above, the PD/LF 700 controls the PD gain based on the charging and discharging phases of the first capacitor C1. In this regard, the PD/LF 700 includes a charge pump 730 including a first FET MP1 (e.g., a PMOS FET), a first resistor R1 (which could be a variable resistor), a second resistor R2 (which could also be a variable resistor), and a second FET MN1 (e.g., an NMOS FET) coupled in series between an upper voltage rail Vdd and ground. That is, the first FET MP1 includes a source coupled to the upper voltage rail Vdd, and a gate coupled to the output of the XNOR gate 710. The first resistor R1 is coupled between a drain of the first FET MP1 and the node n1 (e.g., output of the charge pump 730). The second resistor R2 is coupled between the node n1 and a drain of FET MN1. The FET MN1 includes a gate also coupled to the output of the XNOR gate 710, and serving, along with the gate of FET MP1, as the input of the charge pump 730. The FET MN1 includes a source coupled to ground.

The first resistor R1 may be variable to control the charging phase of the first capacitor C1. The second resistor R2 may partially discharge the first capacitor C1 during a discharging phase. In doing so, the sampled voltage vsmp at the top terminal (at node n2) of the first capacitor C1 does not discharge to all the way to ground (0V), but to some voltage Vst above ground. Accordingly, in the next charging phase, the sampled voltage vsmp starts at the voltage Vst and rises in accordance with the charging current to generate the sampled voltage vsmp with a higher peak Vpk. As the PD gain of the PD/LF 700 is directly related to the peak Vpk of the sampled voltage vsmp, higher PD gain may be achieved by controlling the discharging of the first capacitor C1 via the variable resistor R2. The resistor R2 may be variable to set the start voltage Vst.

Figure 8:
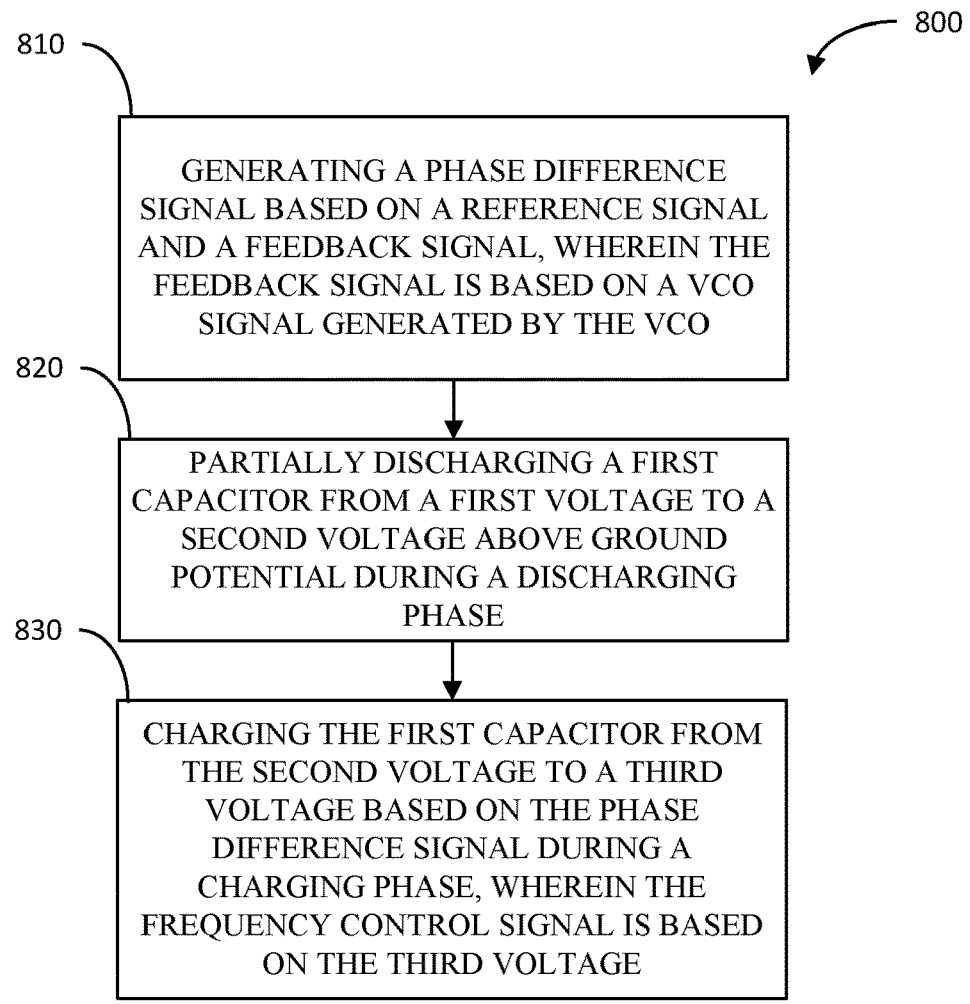
FIG. 8 illustrates a flow diagram of an example method of generating a frequency control signal for a voltage controlled oscillator (VCO) in accordance with another aspect of the disclosure.

FIG. 8 illustrates a flow diagram of an example method 800 of generating a control signal for a voltage controlled oscillator (VCO) in accordance with another aspect of the disclosure. The method 800 includes generating a phase difference signal based on a reference signal and a feedback signal, wherein the feedback signal is based on a VCO signal generated by the VCO (block 810). Examples of means for generating a signal based on a phase difference between a reference signal and a feedback signal include any of the phase/frequency detectors 210, 310, 510, 610, and 710 described herein.

The method 800 further includes partially discharging a first capacitor from a first voltage to a second voltage above ground potential during a discharging phase (block 820). Examples of means for partially discharging a first capacitor from a first voltage to a second voltage above ground potential during a discharging phase include the discharging paths of charge pumps 530, 630, and 730.

Additionally, the method 800 includes charging the first capacitor from the second voltage to a third voltage based on the phase difference signal during a charging phase, wherein the frequency control signal is based on the third voltage (block 830). Examples of means for charging the first capacitor from the second voltage to a third voltage based on the phase difference signal during a charging phase, wherein the frequency control signal is based on the third voltage include the charging paths of charge pumps 530, 630, and 730.

Although not explicitly illustrated, the method 800 may include distributing a charge on the first capacitor with a second capacitor when the first capacitor is charged to the third voltage, to form a fourth voltage across the first and second capacitors, wherein the frequency control signal is based on the third voltage. Examples of means for distributing a charge on the first capacitor with a second capacitor when the first capacitor is charged to the third voltage, to form a fourth voltage across the first and second capacitors include the switching devices SW2 of PD/LFs 500 and 700, and switching device SW3 of PD/LF 600.

Additionally, the method 800 may include controlling the partial discharging of the first capacitor including controlling a resistance of a discharge path between the first capacitor and ground. Examples of means for controlling a resistance of a discharge path between the first capacitor and ground include variable resistors R1 in PD/LFs 500 and 600, and variable resistor R2 in PD/LF 700. The method 800 may also include controlling the charging of the first capacitor including controlling a resistance of a charging path between an upper voltage rail and the first capacitor. An examples of means for controlling the charging of the first capacitor including controlling a resistance of a charging path between an upper voltage rail and the first capacitor includes the variable resistor R1 of PD/LF 700. Further, the method 800 may include controlling the partial discharging of the first capacitor based on the phase difference signal. Examples of means for controlling the partial discharging of the first capacitor based on the phase difference signal include XNOR gates 510 and 710.

Figure 9:
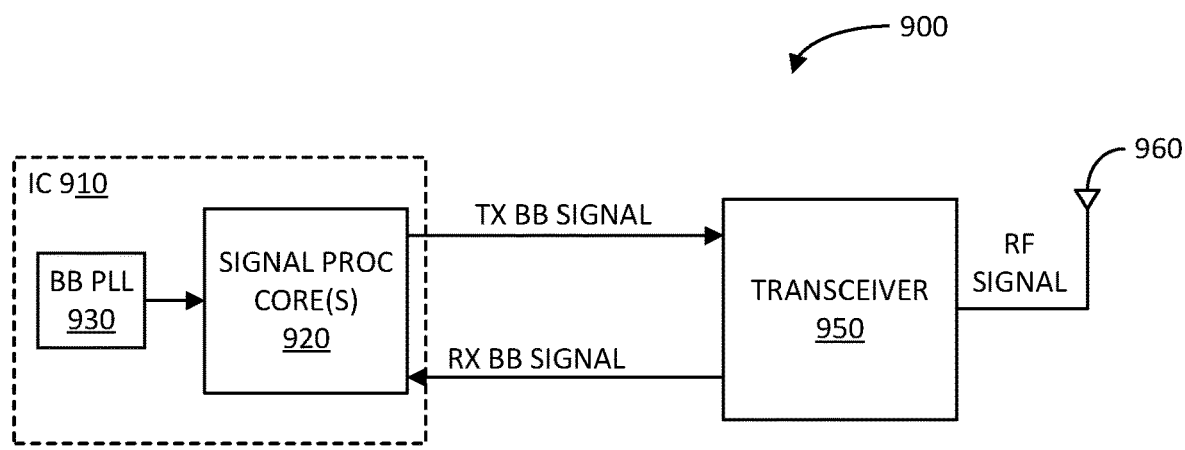
FIG. 9 illustrates a block diagram of an example wireless communication device in accordance with another aspect of the disclosure.

FIG. 9 illustrates a block diagram of an example wireless communication device 900 in accordance with another aspect of the disclosure. The wireless communication device 900 may be a smart phone, a desktop computer, laptop computer, tablet device, Internet of Things (IOT), wearable wireless device (e.g., wireless watch), and other types of wireless device.

In particular, the wireless communication device 900 includes an integrated circuit (IC) 910, which may be implemented as a system on chip (SOC). The IC 910 includes one or more signal processing cores 920 configured to generate a transmit (Tx) baseband (BB) signal and process a received (Rx) baseband (BB) signal. The IC 910 further includes a baseband (BB) phase lock loop (PLL) 930 configured to provide a clock signal to the one or more signal processing cores 920 for controlling the transmission and reception of the Tx BB signal and the Rx BB signal, respectively. The PLL 930 may be implemented as described herein.

The wireless communication device 900 may further include a transceiver 950 and at least one antenna 960 (e.g., an antenna array). The transceiver 950 is coupled to the one or more signal processing cores 920 to receive therefrom the Tx BB signal and provide thereto the Rx BB signal. The transceiver 950 is configured to convert the Tx BB signal into a transmit (Tx) radio frequency (RF) signal, and convert a received (Rx) RF signal into the Rx BB signal. The transceiver 950 is coupled to the at least one antenna 960 to provide thereto the Tx RF signal for electromagnetic radiation into a wireless medium for wireless transmission, and receive the Rx RF signal electromagnetically picked up from the wireless medium by the at least one antenna 960.

The following provides an overview of aspects of the present disclosure:

Aspect 1: An apparatus, comprising: a phase lock loop (PLL), including: a phase detector and loop pass filter (PD/LF), including: a phase/frequency detector including a first input configured to receive a reference signal, and a second input configured to receive a feedback signal, and an output configured to produce an output signal based on the reference and feedback signals; a first capacitor; and a charge pump, including: a charging path configured to produce a charging current to charge the first capacitor based on the output signal; and a discharging path including a first resistor configured to discharge the first capacitor.

Aspect 2: The apparatus of aspect 1, wherein the first resistor comprises a variable resistor.

Aspect 3: The apparatus of aspect 1 or 2, wherein the discharging path is configured to partially discharge the first capacitor during a discharging phase.

Aspect 4: The apparatus of any one of aspects 1-3, wherein: the charging path comprises a first field effect transistor (FET) coupled between an upper voltage rail and a first node; and the discharging path comprises the first resistor and a second FET coupled in series between the first node and a lower voltage rail, wherein gates of the first and second FETs are coupled to the output of the phase/frequency detector.

Aspect 5: The apparatus of aspect 4, wherein the charging path further comprises a second resistor coupled between the first FET and the first node.

Aspect 6: The apparatus of aspect 5, wherein the second resistor comprises a variable resistor.

Aspect 7: The apparatus of any one of aspects 4-6, wherein the PD/LF further comprises: a first switching device coupled between the first node and a second node, wherein the first capacitor is coupled between the second node and the lower voltage rail.

Aspect 8: The apparatus of aspect 7, wherein the PD/LF further comprises: a second switching device coupled between the second node and a third node; and a second capacitor coupled between the third node and the lower voltage rail.

Aspect 9: The apparatus of aspect 8, wherein the PD/LF further comprises a non-overlapping clock generator configured to generate: a non-complementary clock signal based on the feedback signal, wherein the non-complementary clock signal controls an on/off state of the first switching device; and a complementary clock signal based on the feedback signal, wherein the complementary clock signal controls an off/off state of the second switching device.

Aspect 10: The apparatus of aspect 8 or 9, further comprising a voltage controlled oscillator (VCO) coupled to the third node.

Aspect 11: The apparatus of aspect 10, wherein the PLL further comprises a frequency divider configured to generate the feedback signal based on a VCO signal generated by the VCO.

Aspect 12: The apparatus of any one of aspects 1-11, wherein the phase/frequency detector comprises an exclusive NOR gate.

Aspect 13: The apparatus of any one of aspects 1-3, wherein: the charging path comprises a current source and a first switching device coupled in series between an upper voltage rail and a first node, wherein an on/off state of the first switching device is controlled by the output signal of the phase/frequency detector; and the discharging path comprises the first resistor and a second switching device coupled in series between the first node and a lower voltage rail.

Aspect 14: The apparatus of aspect 13, wherein the first capacitor is coupled between the first node and the lower voltage rail.

Aspect 15: The apparatus of aspect 14, wherein the PD/LF further comprises: a third switching device coupled between the first node and a second node; and a second capacitor coupled between the second node and the lower voltage rail.

Aspect 16: The apparatus of aspect 15, wherein: the PD/LF further comprises a control circuit configured to generate a first control signal and a second control signal, wherein the first and second control signals are based on the reference signal; an on/off state of the second switching device is controlled by the first control signal; and an on/off state of the third switching device is controlled by the second control signal.

Aspect 17: The apparatus of aspect 15 or 16, wherein the PLL further comprises a voltage controlled oscillator (VCO) coupled to the second node.

Aspect 18: The apparatus of aspect 17, wherein the PLL further comprises a frequency divider configured to generate the feedback signal based on a VCO signal generated by the VCO.

Aspect 19: A method of generating a frequency control signal for a voltage controlled oscillator (VCO), comprising: generating a phase difference signal based on a reference signal and a feedback signal, wherein the feedback signal is based on a VCO signal generated by the VCO; partially discharging a first capacitor from a first voltage to a second voltage above ground potential during a discharging phase; and charging the first capacitor from the second voltage to a third voltage based on the phase difference signal during a charging phase, wherein the frequency control signal is based on the third voltage.

Aspect 20: The method of aspect 19, further comprising distributing a charge on the first capacitor with a second capacitor when the first capacitor is charged to the third voltage, to form a fourth voltage across the first and second capacitors, wherein the frequency control signal is based on the fourth voltage.

Aspect 21: The method of aspect 19 or 20, further comprising controlling the partial discharging of the first capacitor including controlling a resistance of a discharge path between the first capacitor and ground.

Aspect 22: The method of any one of aspects 19-21, further comprising controlling the charging of the first capacitor including controlling a resistance of a charging path between an upper voltage rail and the first capacitor.

Aspect 23: The method of any one of aspects 19-22, further comprising controlling the partial discharging of the first capacitor based on the phase difference signal.

Aspect 24: An apparatus for generating a frequency control signal for a voltage controlled oscillator (VCO), comprising: means for generating a phase difference signal based on a reference signal and a feedback signal, wherein the feedback signal is based on a VCO signal generated by the VCO; means for partially discharging a first capacitor from a first voltage to a second voltage above ground potential during a discharging phase; and means for charging the first capacitor from the second voltage to a third voltage based on the phase difference signal during a charging phase, wherein the frequency control signal is based on the third voltage.

Aspect 25: The apparatus of aspect 24, further comprising means for distributing a charge on the first capacitor with a second capacitor when the first capacitor is charged to the third voltage, to form a fourth voltage across the first and second capacitors, wherein the frequency control signal is based on the fourth voltage.

Aspect 26: The apparatus of aspect 24 or 25, further comprising means for controlling the partial discharging of the first capacitor including controlling a resistance of a discharge path between the first capacitor and ground.

Aspect 27: The apparatus of any one of aspects 24-26, further comprising means for controlling the charging of the first capacitor including controlling a resistance of a charging path between an upper voltage rail and the first capacitor.

Aspect 28: The apparatus of any one of aspects 24-27, further comprising means for controlling the partial discharging of the first capacitor based on the phase difference signal.

Aspect 29: A wireless communication device, comprising: at least one antenna; a transceiver coupled to the at least one antenna; one or more signal processing cores coupled to the transceiver; and a phase lock loop (PLL) coupled to the one or more signal processing cores. The PLL, in turn, comprises a phase detector and loop pass filter (PD/LF), comprising: a phase/frequency detector including a first input configured to receive a reference signal, and a second input configured to receive a feedback signal, and an output configured to produce an output signal based on the reference and feedback signals; a first capacitor; and a charge pump, comprising: a charging path configured to generate a charging current to charge the first capacitor based on the output signal; and a discharging path including a first resistor configured to discharge the first capacitor.

Aspect 30: The wireless communication device of aspect 29, wherein the discharging path is configured to partially discharge the first capacitor during a discharging phase.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising: a phase lock loop (PLL), comprising: a phase detector and loop pass filter (PD/LF), comprising: a phase/frequency detector including a first input configured to receive a reference signal, and a second input configured to receive a feedback signal, and an output configured to produce an output signal based on the reference and feedback signals; a first capacitor; a charge pump, comprising: a charging path configured to generate a charging current to charge the first capacitor based on the output signal, wherein the charging path comprises a first field effect transistor (FET) coupled between an upper voltage rail and a first node; and a discharging path including a first resistor configured to discharge the first capacitor, wherein the discharging path comprises the first resistor and a second FET coupled in series between the first node and a lower voltage rail, wherein gates of the first and second FETs are coupled to the output of the phase/frequency detector and a first switching device coupled between the first node and a second node, wherein the first capacitor is coupled between the second node and the lower voltage rail.

2. The apparatus of claim 1, wherein the first resistor comprises a variable resistor.

3. The apparatus of claim 1, wherein the discharging path is configured to partially discharge the first capacitor during a discharging phase.

4. The apparatus of claim 1, wherein the charging path further comprises a second resistor coupled between the first FET and the first node.

5. The apparatus of claim 4, wherein the second resistor comprises a variable resistor.

6. The apparatus of claim 1, wherein the PD/LF further comprises:
a second switching device coupled between the second node and a third node; and
a second capacitor coupled between the third node and the lower voltage rail.

7. The apparatus of claim 6, wherein the PD/LF further comprises a non-overlapping clock generator configured to generate:
a non-complementary clock signal based on the feedback signal, wherein the non-complementary clock signal controls an on/off state of the first switching device; and
a complementary clock signal based on the feedback signal, wherein the complementary clock signal controls an off/off state of the second switching device.

8. The apparatus of claim 6, wherein the PLL further comprises a voltage controlled oscillator (VCO) coupled to the third node.

9. The apparatus of claim 8, wherein the PLL further comprises a frequency divider configured to generate the feedback signal based on a VCO signal generated by the VCO.

10. The apparatus of claim 1, wherein the phase/frequency detector comprises an exclusive NOR gate.

11. An apparatus, comprising:
a phase lock loop (PLL), comprising:
a phase detector and loop pass filter (PD/LF), comprising:
a phase/frequency detector including a first input configured to receive a reference signal, and a second input configured to receive a feedback signal, and an output configured to produce an output signal based on the reference and feedback signals;
a first capacitor; and
a charge pump, comprising:
a charging path configured to generate a charging current to charge the first capacitor based on the output signal, the charging path comprises a current source and a first switching device coupled in series between an upper voltage rail and a first node, wherein an on/off state of the first switching device is controlled by the output signal of the phase/frequency detector, and wherein the first capacitor is coupled between the first node and the lower voltage rail; and
a discharging path including a first resistor configured to discharge the first capacitor, the discharging path comprises the first resistor and a second switching device coupled in series between the first node and a lower voltage rail.

12. The apparatus of claim 11, wherein the PD/LF further comprises:
a third switching device coupled between the first node and a second node; and
a second capacitor coupled between the second node and the lower voltage rail.

13. The apparatus of claim 12, wherein:
the PD/LF further comprises a control circuit configured to generate a first control signal and a second control signal, wherein the first and second control signals are based on the reference signal;
an on/off state of the second switching device is controlled by the first control signal; and
an on/off state of the third switching device is controlled by the second control signal.

14. The apparatus of claim 12, wherein the PLL further comprises a voltage controlled oscillator (VCO) coupled to the second node.

15. The apparatus of claim 14, wherein the PLL further comprises a frequency divider configured to generate the feedback signal based on a VCO signal generated by the VCO.

16. A method of generating a frequency control signal for a voltage controlled oscillator (VCO), comprising:
generating a phase difference signal based on a reference signal and a feedback signal, wherein the feedback signal is based on a VCO signal generated by the VCO;
partially discharging a first capacitor from a first voltage to a second voltage above ground potential during a discharging phase;

charging the first capacitor from the second voltage to a third voltage based on the phase difference signal during a charging phase, wherein the frequency control signal is based on the third voltage; and distributing a charge on the first capacitor with a second capacitor when the first capacitor is charged to the third voltage, to form a fourth voltage across the first and second capacitors, wherein the frequency control signal is based on the fourth voltage.

17. The method of claim 16, further comprising controlling the partial discharging of the first capacitor including controlling a resistance of a discharge path between the first capacitor and ground.

18. The method of claim 16, further comprising controlling the charging of the first capacitor including controlling a resistance of a charging path between an upper voltage rail and the first capacitor.

19. The method of claim 16, further comprising controlling the partial discharging of the first capacitor based on the phase difference signal.

20. An apparatus of generating a frequency control signal for a voltage controlled oscillator (VCO), comprising:

means for generating a phase difference signal based on a reference signal and a feedback signal, wherein the feedback signal is based on a VCO signal generated by the VCO;

means for partially discharging a first capacitor from a first voltage to a second voltage above ground potential during a discharging phase;

means for charging the first capacitor from the second voltage to a third voltage based on the phase difference signal during a charging phase, wherein the frequency control signal is based on the third voltage; and means for distributing a charge on the first capacitor with a second capacitor when the first capacitor is charged to the third voltage, to form a fourth voltage across the first and second capacitors, wherein the frequency control signal is based on the fourth voltage.

21. The apparatus of claim 20, further comprising means for controlling the partial discharging of the first capacitor including controlling a resistance of a discharge path between the first capacitor and ground.

22. The apparatus of claim 20, further comprising means for controlling the charging of the first capacitor including controlling a resistance of a charging path between an upper voltage rail and the first capacitor.

23. The apparatus of claim 20, further comprising means for controlling the partial discharging of the first capacitor based on the phase difference signal.

\* \* \* \* \*